US006392441B1

(12) United States Patent
Moscaluk

(10) Patent No.: US 6,392,441 B1
(45) Date of Patent: May 21, 2002

(54) FAST RESPONSE CIRCUIT

(75) Inventor: Gary Moscaluk, Divide, CO (US)

(73) Assignee: Ramtron International Corporation, Colorado Springs, CO (US)

( * ) Notice: Subject to any disclaimer, the term of this patent is extended or adjusted under 35 U.S.C. 154(b) by 0 days.

(21) Appl. No.: 09/593,111

(22) Filed: Jun. 13, 2000

(51) Int. Cl.[7] .................. H03K 19/0175; H03K 19/003
(52) U.S. Cl. .......................................... 326/82; 326/26
(58) Field of Search ........................ 326/82–83, 86–87, 326/30–32, 34, 26–27

(56) References Cited

U.S. PATENT DOCUMENTS

| | | | |
|---|---|---|---|
| 3,875,367 A | | 4/1975 | Tanaka |
| 4,547,749 A | | 10/1985 | Kuo |
| 4,812,779 A | | 3/1989 | Wagner |
| 4,815,113 A | | 3/1989 | Ludwig et al. |
| 5,170,073 A | * | 12/1992 | Hahn et al. .................. 327/108 |
| 5,241,429 A | | 8/1993 | Holsinger |
| 5,274,339 A | | 12/1993 | Wideman et al. |
| 5,438,282 A | | 8/1995 | Kuo |
| 5,448,180 A | | 9/1995 | Kienzler et al. |
| 5,459,438 A | | 10/1995 | Mirow |
| 5,463,331 A | | 10/1995 | Kuo |
| 5,465,076 A | | 11/1995 | Yamauchi et al. |
| 5,485,126 A | | 1/1996 | Gersbach et al. |
| 5,489,862 A | * | 2/1996 | Risinger et al. ............ 327/108 |
| 5,539,341 A | | 7/1996 | Kuo |
| 5,543,746 A | | 8/1996 | Kuo |
| 5,638,014 A | | 6/1997 | Kurita |
| 5,642,066 A | | 6/1997 | Burke |
| 5,694,090 A | | 12/1997 | Morgan |
| 5,731,725 A | | 3/1998 | Rothenberger et al. |
| 5,771,301 A | | 6/1998 | Fuller et al. |
| 5,898,343 A | | 4/1999 | Morgan |
| 6,087,847 A | * | 7/2000 | Mooney et al. ............... 326/30 |

FOREIGN PATENT DOCUMENTS

JP             410294652 A     * 11/1998

* cited by examiner

*Primary Examiner*—Michael Tokar
*Assistant Examiner*—James H Cho
(74) *Attorney, Agent, or Firm*—William J. Kubida; Stuart T. Langley; Hogan & Hartson

(57) ABSTRACT

A transmission line driver circuit that minimizes ringing effects while providing an acceptably fast output response. A plurality of increasingly powerful transistors are activated at different times to drive an output signal without ringing under low impedance conditions and quickly under high impedance conditions. The transmission line driver also includes a digital logic circuit. A strong inverter is connected to a digital logic unit. The strong inverter is activated when the first of two conditions is satisfied: 1) a feedback signal drops below a predetermined level; or 2) an output signal from a final delay is received by the output circuit. In this way, the strong driver will always contribute to driving the output signal, but will only do so when there is little likelihood of ringing.

14 Claims, 17 Drawing Sheets

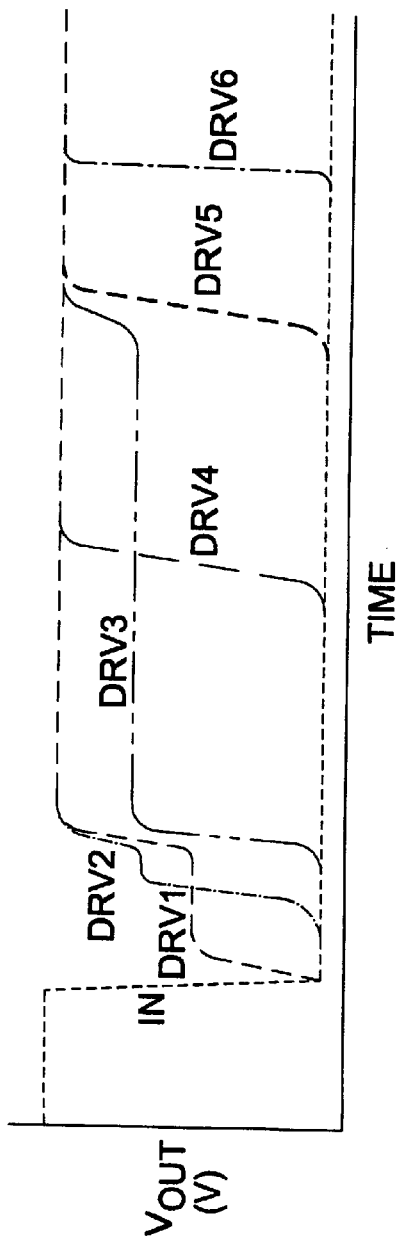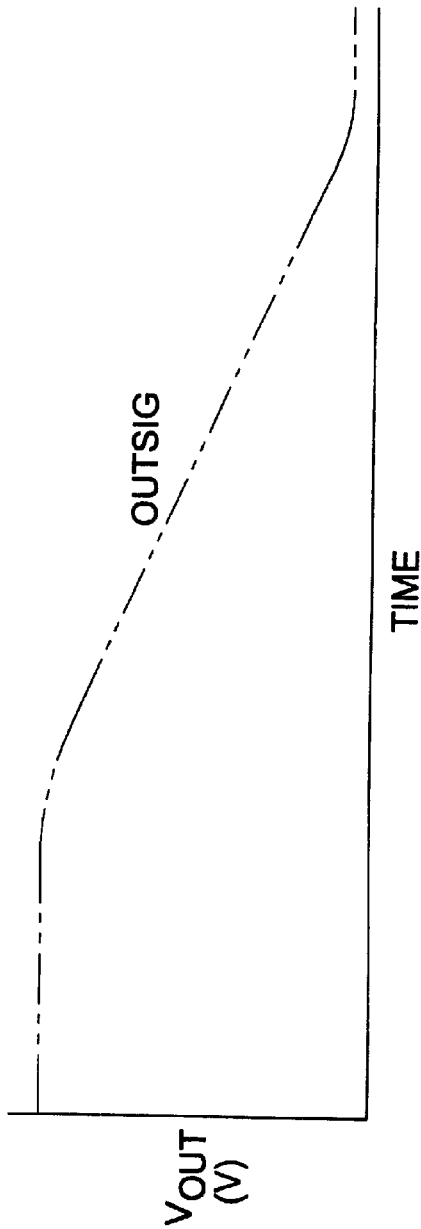
FIG. 11(a)
FIG. 11(b)

FAST RESPONSE CIRCUIT

BACKGROUND OF THE INVENTION

1. Field of the Invention

This invention relates generally to driver circuits. More particularly, the present invention relates to a transmission line driver circuit that minimizes ringing effects while providing a fast output response.

2. Relevant Background

Integrated circuits (ICs) comprise thousands or millions of individual devices interconnected to provide desired functionality. Significant effort is expended to improve processing techniques so as to reduce the size of each individual device in order to provide greater functionality and higher operating speed at reduced cost. Despite advances in integration, complex chips usually require multiple ICs coupled together in modules, circuit boards and the like. In order to function together, data must be transmitted rapidly between ICs. Currently, chip-to-chip transmission speeds are a fraction of the on-chip transmission speeds. Inter-chip data transmission is a significant bottleneck limiting overall system performance.

The physical distance between the input and output devices makes "transmission-line" effects degrade the transmitted signal. Transmission-line effects are due to the impedance of the signal conductor that connect the devices. As the devices are spaced further apart, problems with transmission line effects become more pronounced. Moreover, as bus clock speeds increase, transmission line effects are significant for even relatively short conductor lines. For some types of integrated circuits, such as the fastest ECL chips, transmission-line effects have prevented signal runs from exceeding one inch. These limitations significantly constrain the complexity and performance that can be integrated on a circuit board.

One technique of addressing the transmission-line effects is to utilize a driver to overcome the signal run's impedance and rapidly adjust the signal that is translated to signal bus. Although a conventional driver may be utilized when the signal run has a constant impedance, many factors may cause the impedance to change. When the impedance is high, such as under a maximum load with low source voltage and high temperature, the output signal may have an excessive response to transition from a voltage associated with high logic or power supply voltage (VDD) to a voltage associated with low logic, such as common potential or ground (VSS). Conversely, when there is a minimum load with high source voltage and low temperature, the output signal may have excessive ringing which is seen as noise in the input device.

It would be desirable to have a transmission line driver circuit that minimizes or eliminates transmission line ringing effects on a chip and also provide a fast initial response for a large range of bus impedance without the use of additional external circuitry. Further, a need exists for a driver circuit that readily adapts to the varying load conditions found in practical systems.

SUMMARY OF THE INVENTION

The present invention provides fast initial response times for a large range of bus impedances while limiting ringing caused by aggressively driving the output. The present invention involves the use of a plurality of delay circuits to synchronize the activation of a plurality of output driver transistors. An input signal is received and propagates through each of the delays in series, and each delay is connected to at least one threshold voltage drop or inverter module. Each of the threshold voltage drops and inverter modules are, in turn, connected to a driver that is in turn connected to the output bus. In this way, the signal is driven by progressively stronger devices.

The invention integrates a feedback signal into a fast response circuit. This feedback signal measures an output signal at a predetermined time after a first weak threshold voltage drop is activated to determine whether the output signal is being driven to ground (GND) at a satisfactory rate. When the output signal falls below a predetermined voltage within a predetermined time, a strong inverter activates and causes the output signal to be driven to ground. If the output signal is not below the predetermined voltage at the predetermined time, the strong inverter activates automatically. By delaying the activation of the strong inverter until either the output signal is sufficiently low or the predetermined time has elapsed, the ringing effects would not exist since the activation of the strong inverter is designed to conduct when the output is at approximately 25% VDD.

According to the present invention, an input signal is received and propagates through each of the delays in series, and each delay is connected to at least one threshold voltage drop or inverter module. Each of the threshold voltage drops and inverter modules are, in turn, connected to a driver. The driver is, in turn, connected to the output bus. In one embodiment, as the input signal propagates through each delay, an output device stronger than the previous output device is activated. This result may be achieved by using devices that result in different currents and voltages being applied to the output bus. In one embodiment, devices ranging in strength and voltage from a weak threshold voltage drop to a semi-weak inverter may be used. In this way, the driver circuit both drives the output signal quickly to low when there is high impedance and avoids ringing when there is low impedance.

In another aspect, the present invention involves a digital logic circuit that can be used to activate a strong inverter. The digital logic circuit may be adaptive in that the strong inverter is selectively activated based upon feedback and the passage of a predetermined amount of time. For example, the digital logic circuit may receive a feedback signal from the output bus and a timing signal from the final delay. The digital logic circuit may be configured so that the strong inverter is fired either when the feedback signal drops below a predetermined threshold voltage or after a predetermined amount of time, whichever comes first. Once the first of these conditions is satisfied, the strong inverter is activated in order to "slam" the output signal to VSS. In one embodiment, the predetermined threshold is 25% of VDD.

In another aspect, the present invention involves a method for rapidly driving an output signal to a supply rail voltage (e.g., ground) without causing ringing under both high and low transmission line impedance conditions. Using a series of delays and a plurality of threshold voltage drop and inverter modules, an output signal is driven to ground with increasingly stronger modules. In a preferred embodiment, a strong inverter is activated after a predetermined amount of time to drive output signals to ground when there is a large impedance tied to the bus.

The foregoing and other objects, features and advantages of the invention will become more readily apparent from the following detailed description of a preferred embodiment of the invention which proceeds with reference to the accompanying drawings.

BRIEF DESCRIPTION OF THE DRAWINGS

FIG. 11(a) and FIG. 11(b) are dual graphs for a line capacitance of 400 pf depicting the signal response time in the bottom graph and the driver timing on the top graph.

DETAILED DESCRIPTION

Figure 1:
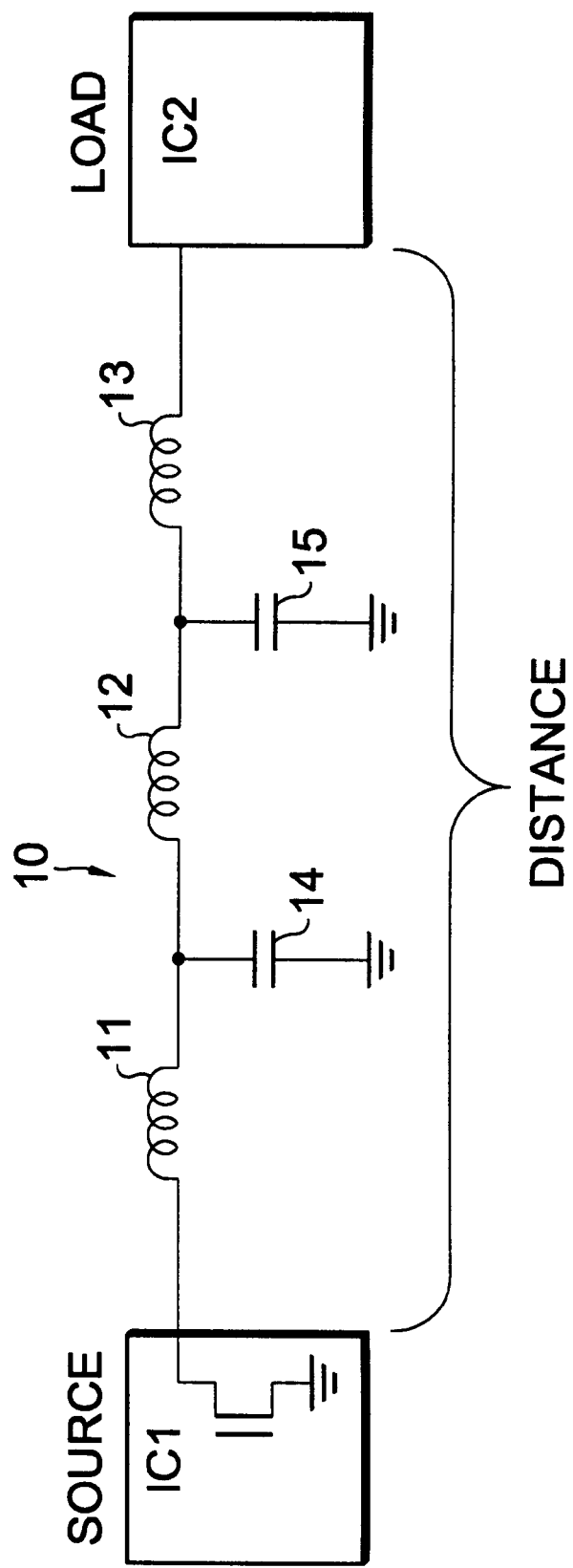
FIG. 1 depicts an environment in which transmission line effects arise.
Figure 2:
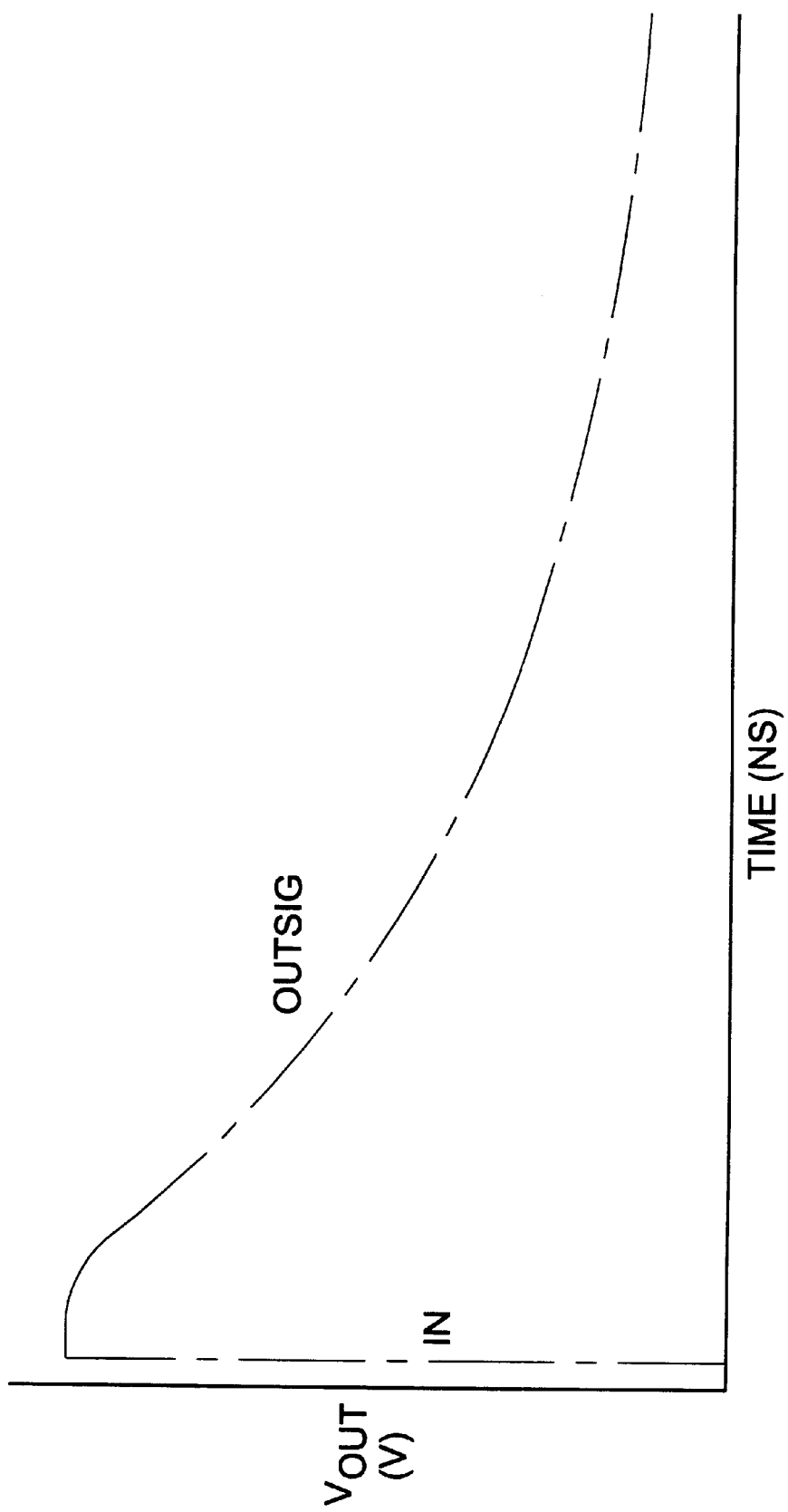
FIG. 2 depicts a slow response time when an output signal is driven under a high impedance load by a prior art driver circuit.
Figure 3:
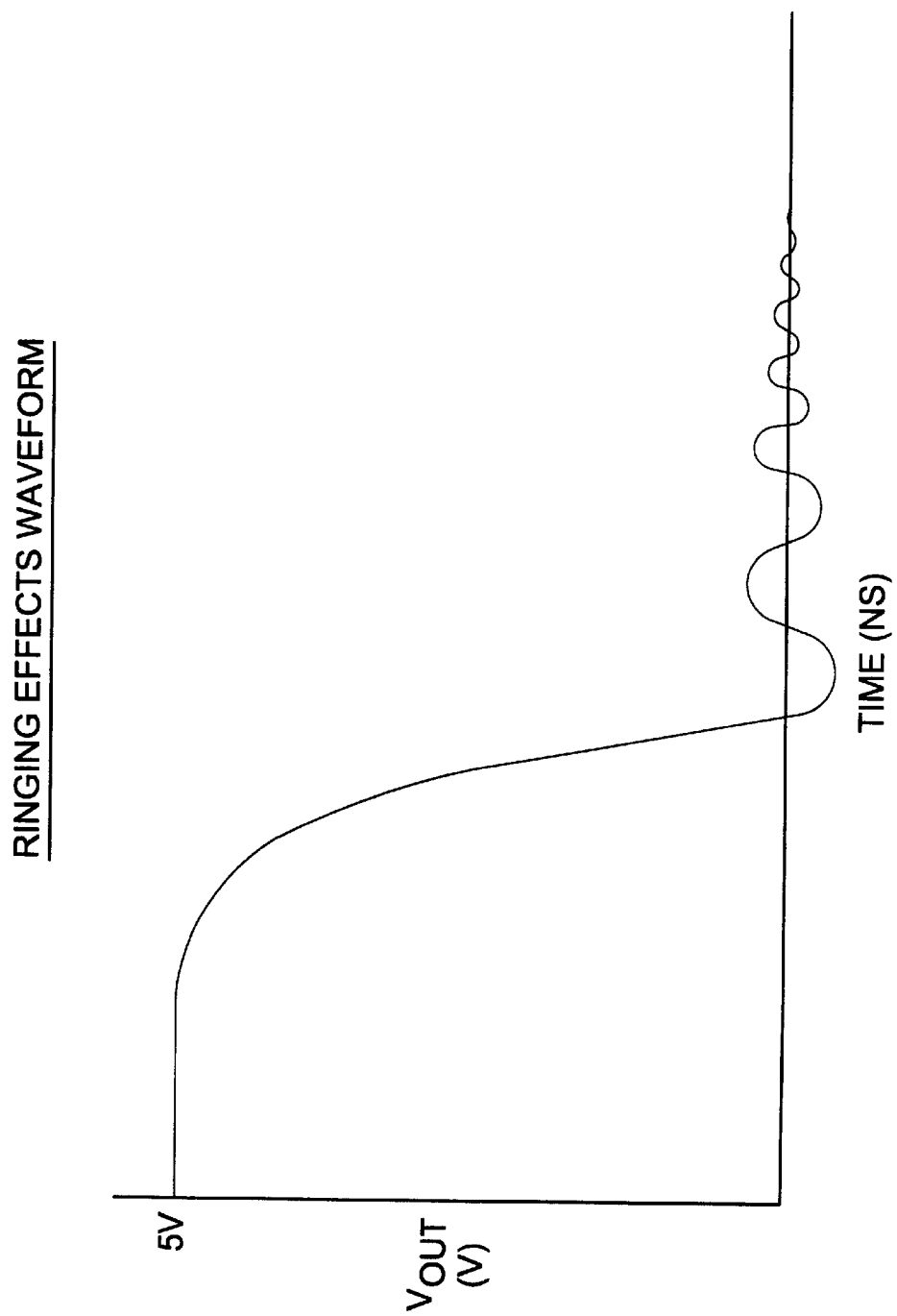
FIG. 3 depicts ringing effects that occur when an output signal is driven under a low capacitive load by a prior art driver circuit.

FIG. 1 is a high block diagram representing a source integrated circuit (IC1) and a load integrated circuit (IC2) connected by a transmission line 10. Along the transmission line 10, there are a plurality of parasitic and/or explicit impedance elements such as inductors 11, 12 and 13 and a plurality of capacitors 14 and 15. Impedance elements 11–15 typically are parasitic elements associated with the conductive line 10 but may also include explicit devices coupled to line 10 as signal conditioners, filters, and the like. When there is a high impedance on a transmission line 10, a driver in accordance with the prior art may cause a slow transition from VDD to VSS, as depicted in FIG. 2. When there is low impedance on a transmission line 10, a driver in accordance with the prior art may cause ringing, as shown in FIG. 3.

Figure 4:
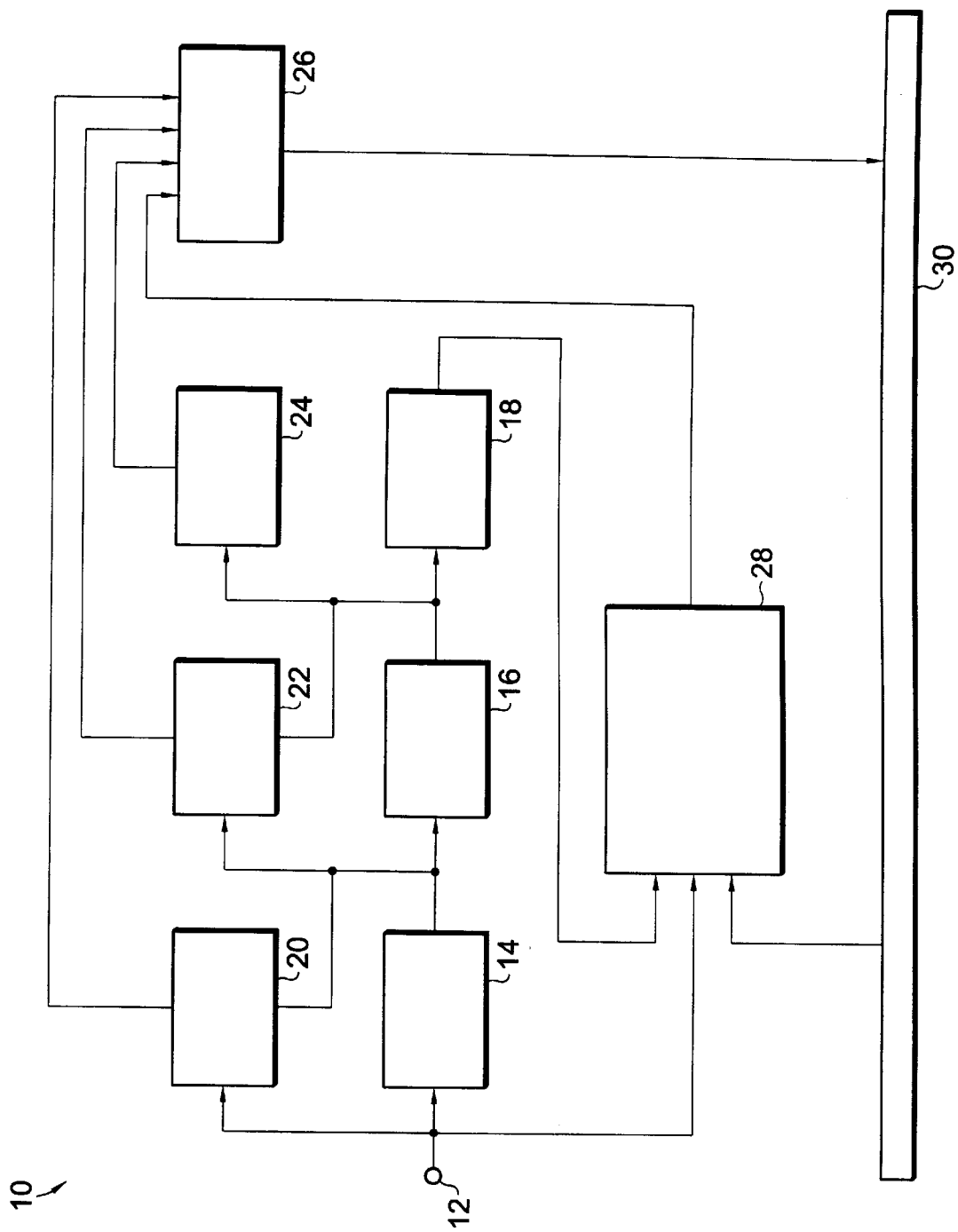
FIG. 4 shows in block diagram form a first embodiment of the present invention.

Referring now to FIG. 4, a block diagram of a transmission line driver circuit 10 of the present invention is shown. In general, transmission line driver circuit 10 includes an input node 12 for receiving an input pulse or step signal, a series of delay circuits 14, 16, and 18, a series of step-generator circuits 20, 22, and 24, a main driver circuit 26 for driving the transmission line 30, and a digital logic feedback circuit 28. While three delay circuits 14, 16, and 18 are shown, any number greater than or equal to two can be used. Correspondingly, while three step-generator circuits 20, 22, and 24 are shown, any number greater than or equal to two can be used. The exact number of delay and step-generator circuits used is determined by a tradeoff between the granularity of performance desired and the extra cost and complexity of extra circuitry.

Delay circuits 14, 16, and 18 are coupled to receive the input pulse and are implemented using, for example, resistor capacitor (RC) delay networks, inverter circuits using long length transistors, CMOS RC equivalent circuits, or the like. Step-generator circuits 20, 22, and 24 are also coupled to input node 12 and each generate an output signal to main drive circuit 26.

Figure 7:
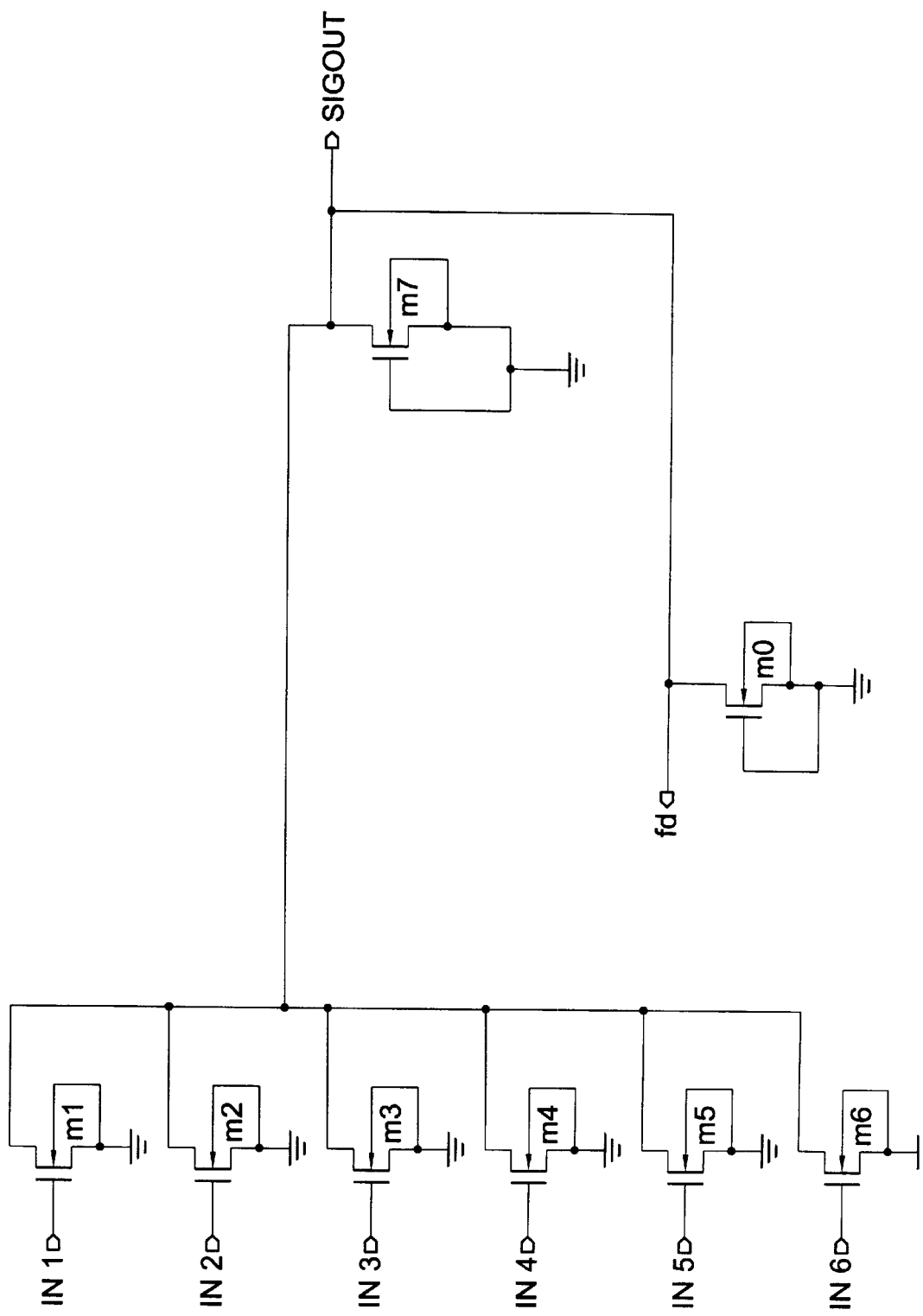
FIG. 7 is a circuit diagram of a driver in accordance with the present invention.

Main driver circuit 26 has multiple inputs for receiving the output signals of step-generator circuits and a single output for driving transmission line 30 as depicted in FIG. 7 and explained further below. A digital logic circuit 28 is used to feedback information from transmission line 30 under high impedance load conditions to an input of the main driver circuit 26 to initiate additional drive capability, as well as complete output signal transition for low impedance load conditions.

Figure 4A:
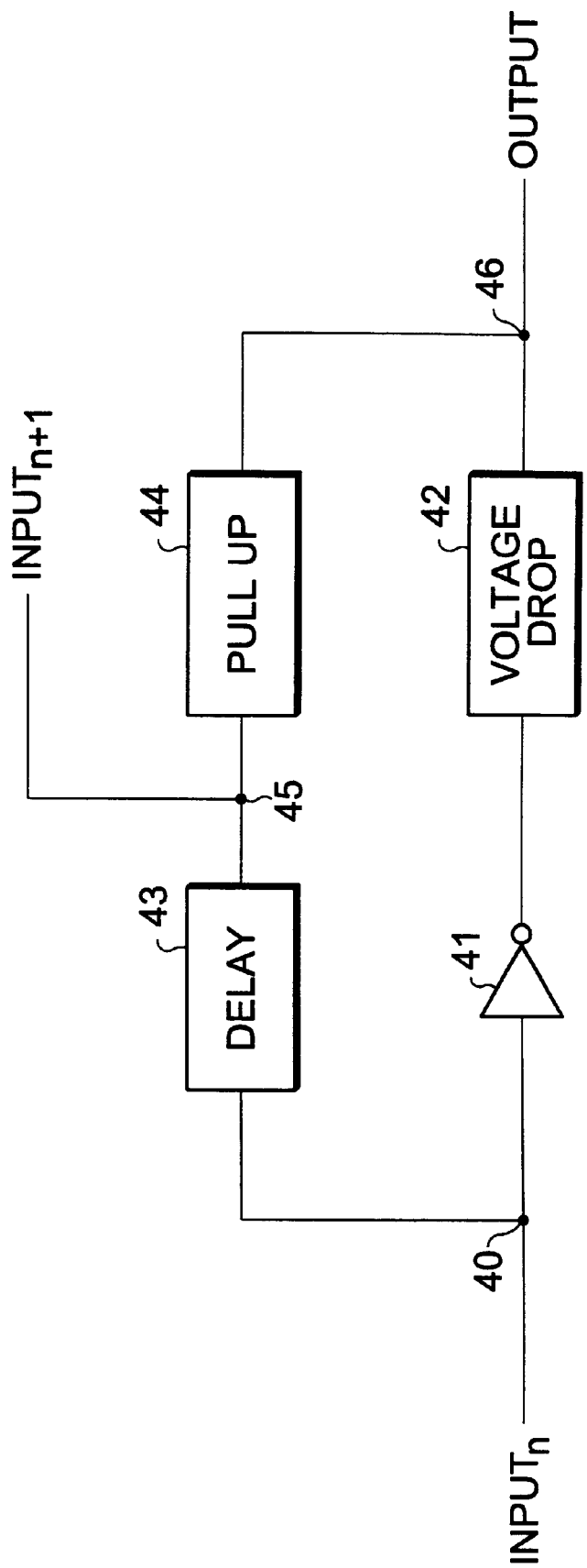
FIG. 4(a) shows a schematic representation of a single stage in accordance with the present invention.

FIG. 4(a) shows a functional block diagram representation of a single stage in accordance with the present invention. An input signal is received at input node 40. An output signal to main driver 26 flows through node 46, and an input to one or more subsequent stage(s) flows through node 45. Each stage includes a combination of devices including inverters, voltage drops, delays and pull-ups. The stage may include more than one of each of these devices. Also, each stage may omit one or more types of devices (e.g., a stage may have zero delay or zero voltage drop). Additionally, the stage may include other devices to suit the needs of a particular application. The relative magnitude and timing of the output signals generated each stage provide precise edge-shaping and conditioning of the output signal driving the transmission line as described in greater detail below.

In one embodiment, the input signal propagates simultaneously to inverter 41 and delay 43. At this particular time the signal is at VSS which is inverted and provides the voltage drop module 42 with a high logic level (VDD). The voltage drop module 42 then supplies a voltage which is a threshold or more below VDD and the transition time for this voltage to change depends on the size of the devices used to implement voltage drop module 42. Long length devices would provide a slow transition of node 46, whereas large widths would provide a faster transition of node 46. For classification, a weak Vt drop module provides a slow transition of node 46. A semi-weak Vt drop module provides a moderate transition of node 46 and a strong Vt drop module provides a fast transition of node. The same classifications, in terms of strength, apply to an inverter module 41 as described above for the voltage drop module 42. In a particular implementation, voltage drop module 42 is implemented using field effect transistor (FET) threshold voltage drops coupled in series to provide a predetermined voltage drop. The predetermined voltage provided by voltage drop module 42 could be 1Vt, 2Vt, etc., depending on the supply voltage and voltage level that is desired. The output of voltage drop unit 42 is then transmitted as an output signal to main driver 26.

Returning to node 40, the input signal is received by delay 43. All activity that occurs after the signal propagates through delay 43 is referred to as phase 2 activity. Delay 43 may include any number of unit time delays. For example, delay 43 may delay the input signal one unit time delay, two unit time delays to n unit time delays. Once the input signal propagates through delay 43, the signal is transitioned to the next stage and to pull up device 44 through node 45. In a preferred embodiment, pull-up 44 brings the voltage at node 46 to VDD. In this manner each stage drives output node 46 in two phases where a first phase is controlled by the drive strength and voltage drop of voltage drop unit 42 and the second phase is controlled by the drive strength of pull-up unit 44.

Figure 5:
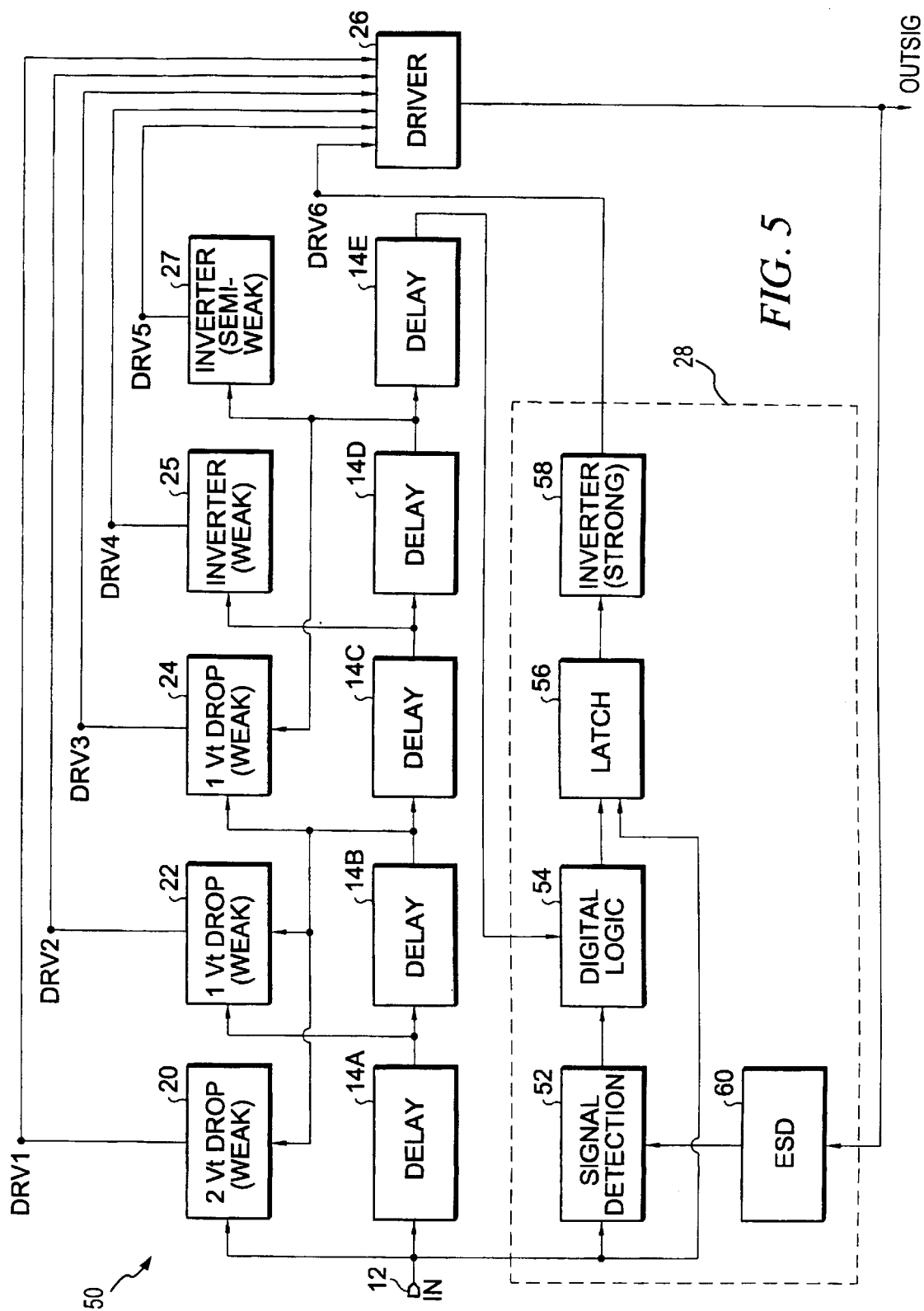
FIG. 5 shows in block diagram form a second embodiment of the present invention.
Figure 6:
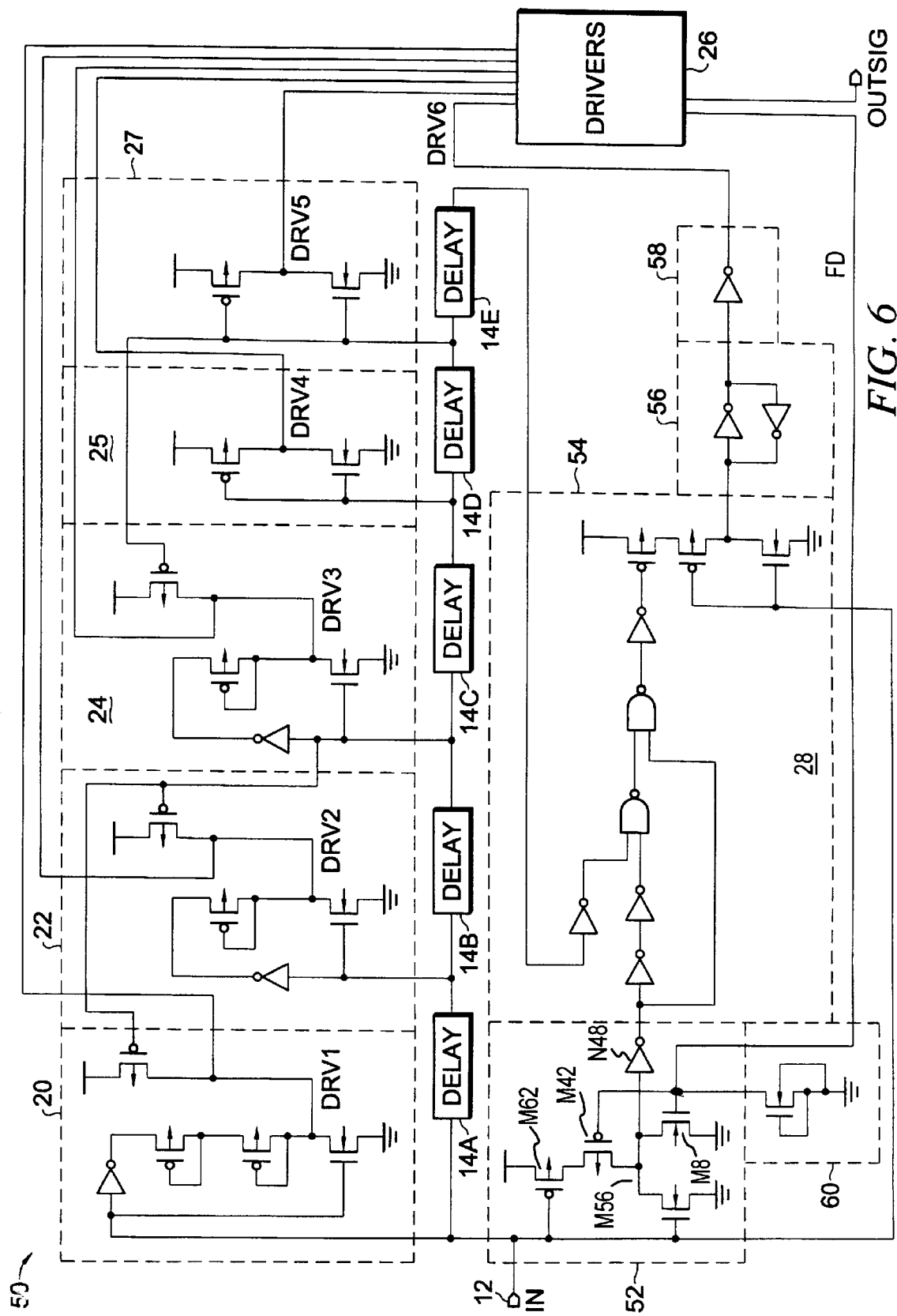
FIG. 6 is a circuit diagram of an embodiment of the present invention implemented using N-channel field effect devices.

FIGS. 5 and 6 show a second embodiment of the present invention. The primary distinction between the first embodiment and the second embodiment is that FIGS. 5 and 6 include stages having different delay, voltage drop and pull-up configurations, and there are six stages instead of four. FIG. 5 is a functional block diagram depiction of the second embodiment of the present invention. A signal is received at node 12. The output signal OUTSIG is conditioned by a plurality of temporally spaced, varying strength and voltage step generator circuits in order to have a quick response time without ringing. Additionally, circuit 50 includes a digital logic circuit 28 that has a strong inverter 58 that is selectively activated to drive the output signal OUTSIG quickly to VSS when the digital logic circuit 28 determines that the activation of strong inverter 58 will not cause ringing.

The input signal IN is transmitted simultaneously to delay 14A and step-generator circuit 20. Step-generator circuit 20 is a weak 2Vt drop module. Accordingly, a weak VDD−2Vt voltage signal is propagated on DRV1. The pull-up (not shown) associated with step-generator circuit 20 is activated two delay time units after the input signal transitions, as described below. The pull-up brings the signal on DRV1 to a full VDD level.

After the input signal propagates through the first delay 14A, it is transmitted simultaneously to step-generator circuit 22 and delay 14B. As with step-generator circuit 20, there is a weak Vt drop module. However, step-generator circuit 22 includes only a 1Vt drop, meaning that the associated pull-up will only increase the voltage by 1Vt when it is activated. Furthermore, the pull-up associated with step-generator circuit 22 is activated one delay time unit after delay 14B, substantially simultaneous with the pull-up associated with step-generator circuit 20.

After the input signal propagates through delay 14B, the signal is transmitted simultaneously to step-generator circuit 24, delay 14C and the pull-ups associated with step-generator circuits 20 and 22. Because the inverter associated with step-generator circuit 24 is a stronger Vt drop module (semi-weak as opposed to weak), more VDD current is supplied through DRV3 than was supplied through either DRV1 or DRV2. This corresponds to a faster signal response on DRV3 versus DRV2 or DRV1.

Step-generator circuits 25 and 27 are similar in operation to the previous step-generator circuits 20, 22, and 24. However, there is no voltage drop associated with either step-generator circuit 25 or 27. Accordingly, unlike the multi-phase operation of circuits 20, 22 and 24, there is no pull-up associated with circuits 25 and 27. These circuits transition DRV4 and DRV5 to VDD prior to the activation of a subsequent delay 14D and 14E, respectively.

As the input signal propagates through the final delay 14E, the signal is transmitted through digital logic 54 to latch 56. If strong inverter 58 has not already been activated, it will activate upon transmission of the input signal from delay 14E. Strong inverter 58 is either activated based upon transmission of the input signal from the final delay 14E or based upon a predetermined voltage being detected on transmission line 30, as described in more detail below.

Turning to FIG. 6, which is a schematic illustration of the circuit shown in FIG. 5, output bus 30 may include pull-up resistors (not shown) for an open-drain configuration, which in an idle state keeps the bus at the VDD power supply voltage (typically 3, 3.3, or 5 volts). When the input signal at node 12 switches from high to low, the first step-generator circuit 20 is activated once the gate-drain of device M16 transitions high. This produces a signal voltage of VDD−2Vt (where Vt is the transistor voltage threshold) on node DRVI, which in turn connects to one of the output driver transistors in driver block 26.

Figure 8A:
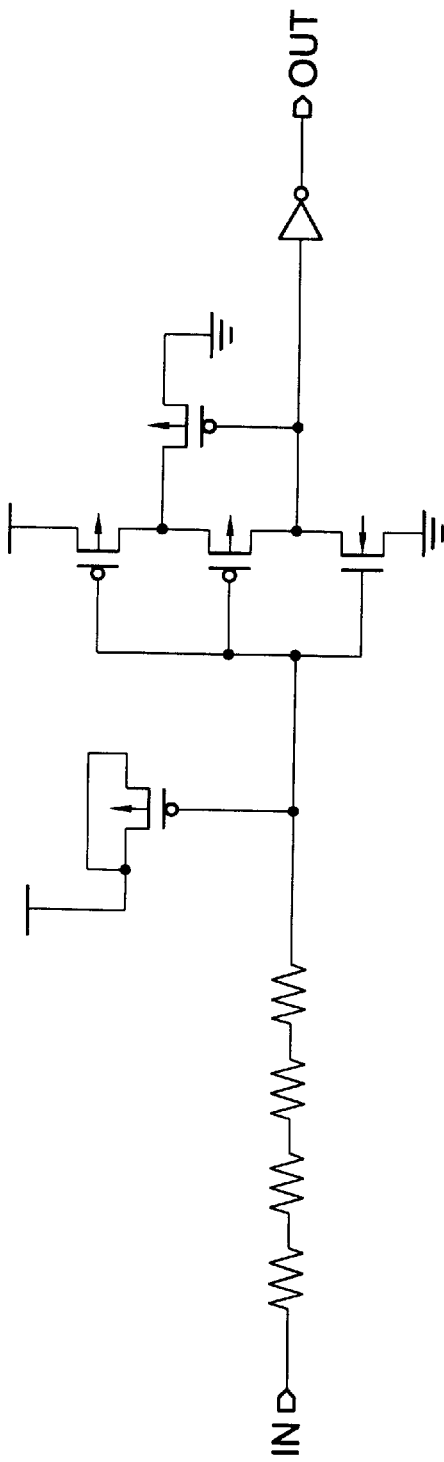
FIGS. 8(a) to 8(c) represent three delay elements that may be used in the present invention.
Figure 8B:
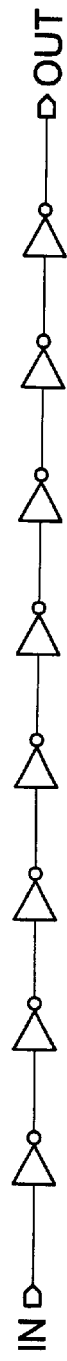
Figure 8C:
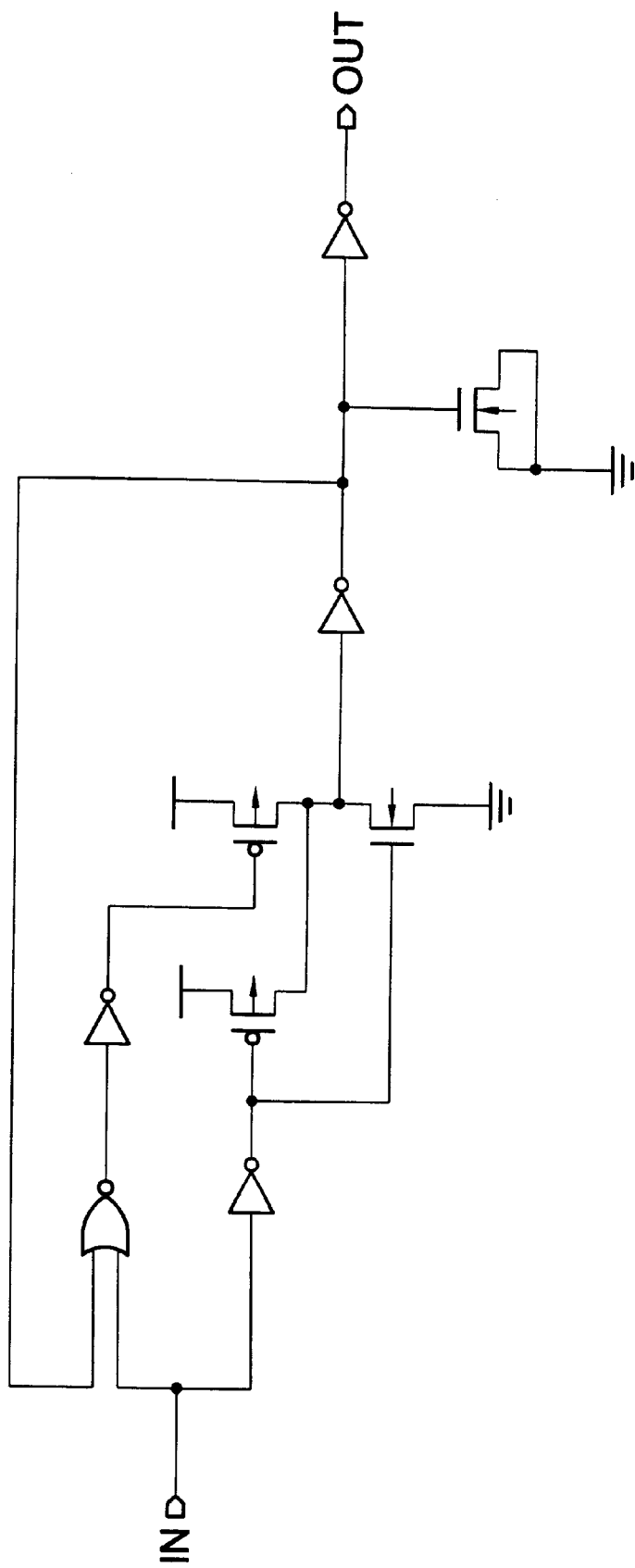

As node DRV1 supplies a voltage to the driver block 26, the input signal IN is deferred by a first delay circuit 14A before the next input stage 22 becomes active. The delay circuits 14A through 14E can consist of either a resistor/capacitor (RC) network, long length (L) inverters or CMOS RC equivalent circuits as shown in FIGS. 8(a) to 8(c). Once the input signal propagates to the next input stage 22, transistor M46 begins to conduct, supplying node DRV2 with a voltage level equivalent to VDD−Vt. The next input stage 24 operates in a similar manner, except that the voltage drops and strengths are modified as described above. In a preferred embodiment, after the first two step-generator circuits 20 and 22, the output from the delay circuit (14B) will pull up nodes DRV1 and DRV2 to VDD via the P-channel pull-up devices.

Circuit 50 includes a signal detection circuit 52 which comprises transistors M62, M42, M56 and M8 as well as devices 60 and N48. The signal detection circuit 52 monitors the feedback signal, FD. Circuit 50 additionally includes electrostatic discharge protection for an ESD event. Once the input signal IN transitions low, the FD signal will be at the VDD power supply level, and as the individual step-generator circuits 20, 22, 24, 25, and 27 are activated, the bus output signal OUTSIG will transition to VSS. Step-generator circuits 20, 22, 24, 25, and 27 can be formed of P-channel or N-channel transistors, and diode-connected P-channel or N-channel transistors. Bipolar transistors or other switching technology may also be used.

The exact rate that the output signal OUTSIG falls to VSS depends on the bus impedance and the atmospheric, processing and voltage conditions. For conditions where there is very little bus impedance, high voltage and cold temperature, the bus signal transitions very quickly. This is the situation where the output fall time can contribute to ringing effects if the output signal transitions too rapidly. Circuit 50 of the present invention works well to insure that this does not happen by using the first step-generator circuit 20, which has a 2Vt drop weak signal to gradually pull the bus signal OUTSIG to VSS. In addition to preventing ringing, the present invention also drives the output signal OUTSIG with the strong inverter when the output signal OUTSIG drops below a predetermined level, $V_{low}$. Once the output signal OUTSIG is less than $V_{low}$, the likelihood of ringing effects is low. Accordingly, in a preferred embodiment the strong inverter 56 may activate once the output signal OUTSIG drops below $V_{low}$, thereby speeding the transition to VSS.

On the other side of the spectrum, where conditions such as low voltage, high temperature and high bus impedance exist, the bus signal will have a tendency to transition from VDD to VSS very slowly. The strong inverter 56 may activate once digital logic circuit 28 determines that there is high impedance on the transmission line, because there is a low likelihood that ringing will occur under such conditions. Digital logic circuit 28 may determine that there is high impedance by determining whether output signal OUTSIG exceeds the predetermined threshold $V_{low}$ after the output of the last delay 14E transitions to a high. If the output signal OUTSIG is greater than $V_{low}$ after 14E transitions high, then the strong inverter 56 activates. Accordingly, the strong inverter 56 will activate when either the voltage drops below $V_{low}$ or when the output of the last inverter transitions to high, whichever comes first.

In this way, the output signal may be driven quickly to VSS by driver 26, but with continuous control over ringing. It is up to the designer to determine what percentage of VDD should be used for $V_{low}$. In one embodiment, $V_{low}$ is equal to twenty five percent of VDD. This relationship may be achieved, for example, by having m8 approximately 6.5 times stronger than m42 taking into account the differential mobility between nmos and pmos devices.

FIG. 7 is a circuit diagram of a driver 26 in accordance with the present invention. Driver block 26 has several individual N-channel devices M1, M2, M3, M4, M5, and M6, which pull down the output signal SIGOUT to the VSS supply level (typically ground) and the number of devices is directly related to the number of input stages. In addition to providing the output signal SIGOUT to the output bus, the driver may provide a feedback signal FD back to the signal detection 52 (FIG. 5) via device 60.

There is a direct correlation between the size of the driver and the voltage levels and transition speeds of the gates of the n-channel driver. It is up to the designer to determine the desired sizing for the n-channel driver to meet the needs of a particular application. This would be based on the range of bus impedance, output current, high voltage specifications, as well as voltage and temperature ranges. For instance, under conditions of very low bus capacitance, high voltage and low temperature conditions, the present invention would supply signal to DRV1 and be an input to IN1. Since this signal on DRV1 is at VDD–2Vt, as explained earlier, the gate to source voltage on ml would provide conduction, but not strong conduction. Therefore the device is not able to pull the charge off the output bus and sink the current to ground as quickly as if the gate of ml were at a full VDD level.

For conditions where there is a large bus impedance, all drivers should have their gates at VDD to provide for strong conduction for all drivers. Since the n-channel devices are in parallel, the drive strengths are additive allowing for fast discharge of the output signal. Devices m0, m7 and r0 are used for electrostatic discharge and the Fd node is used as a feedback signal to the signal detection circuit FIGS. 8(a) to 8(c) represent three delay elements that may be used in the present invention. Delay circuits 14, 16, and 18 can include RC delay networks as shown in FIG. 8(a), inverter circuits using long length transistors as shown in FIG. 8(b), CMOS RC equivalent circuits as shown in FIG. 8(c), or the like.

Figure 9A:
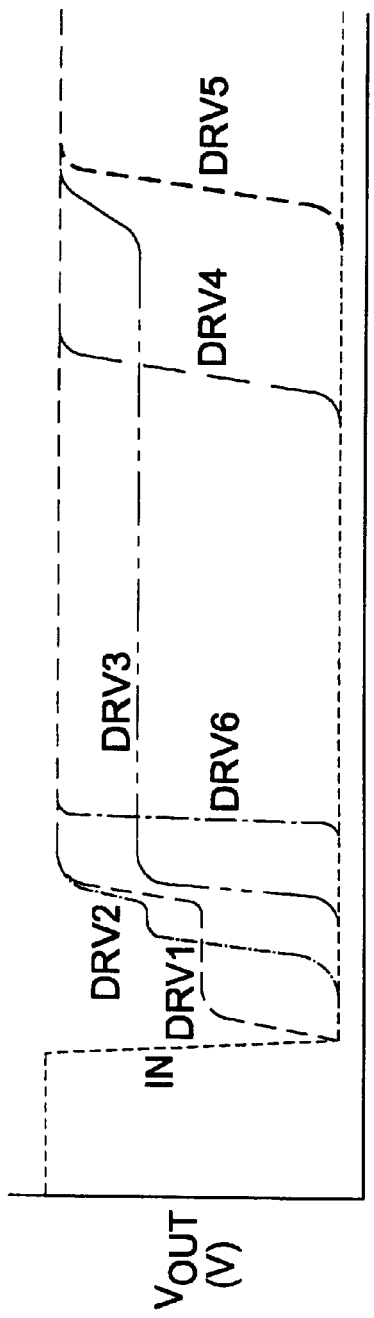
FIG. 9(a) and FIG. 9(b) are dual graphs for a line capacitance of 10 pf depicting the signal response time in the bottom graph and the driver timing on the top graph.
Figure 9B:

FIGS. 9–11 are dual graphs for load capacitances of 10, 100, and 400 pf respectively. FIG. 9(a) and FIG. 9(b) represent an input transmission low at 5.6V–45° C. with the fastest condition for a 5V semiconductor manufacturing process. As shown, OUTSIG has a fall time approximate equal to 15 ns with a load bus capacitance of 10 pf. FIG. 9(a) indicates that under these conditions, DRV1, DRV2 and DRV3 do the bulk of the work and provide a proper response to eliminate ringing on the output.

Figure 10A:
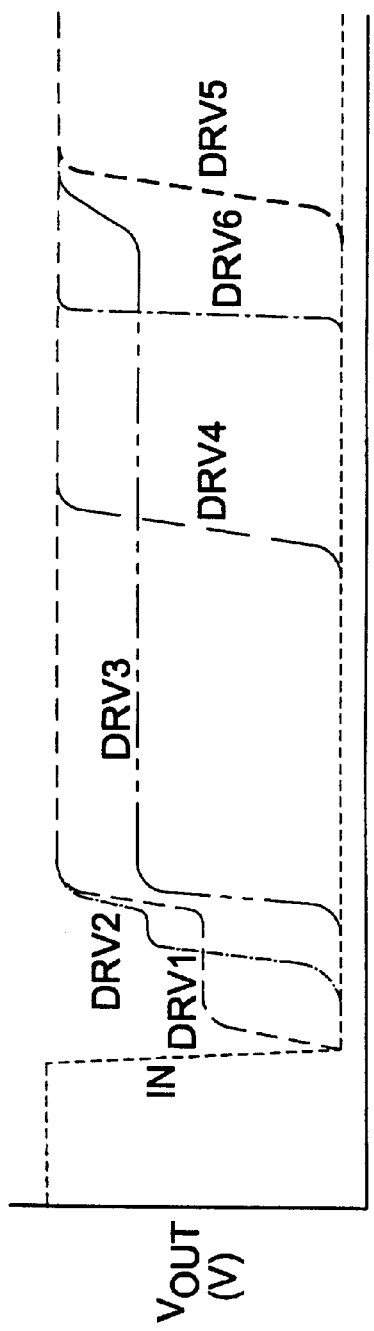
FIG. 10(a) and FIG. 10(b) are dual graphs for a line capacitance of 100 pf depicting the signal response time in the bottom graph and the driver timing on the top graph.
Figure 10B:
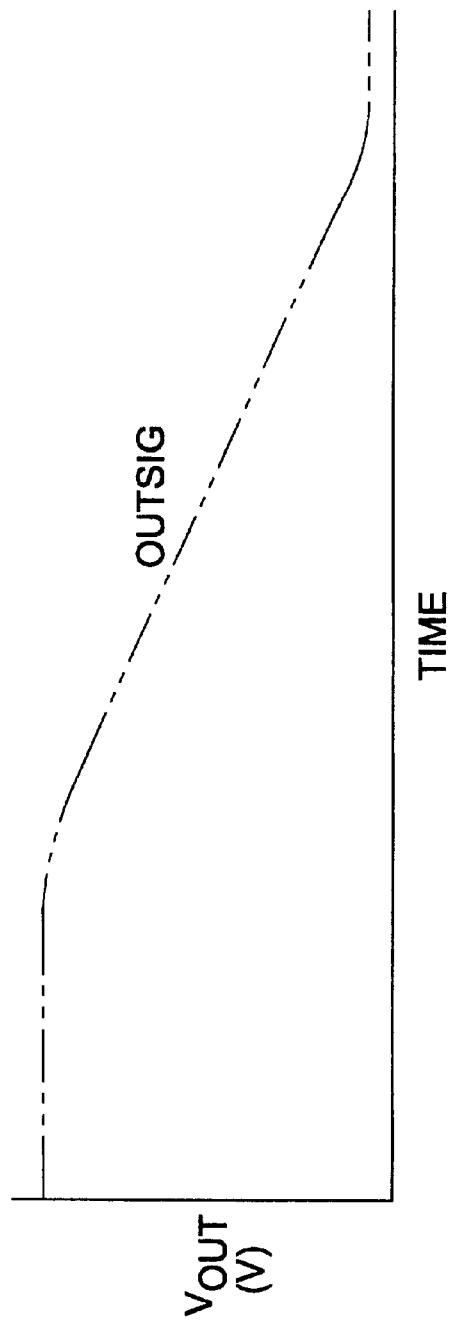

The nominal condition is for nominal processing, room temperature and 5V supply. FIG. 10(b) illustrates the output response for an input transition low at 5V 27° C. nominal processing with a load bus capacitance of 100 pf. FIG. 10(a) shows the DRV signals responses for this condition with the corresponding output signal, OUTSIG. The output response exhibits a fairly linear relationship with time which keeps the fall time satisfactory.

FIG. 11(a) and FIG. 11(b) represent an input transition low at 4.4v 90° C. with poor process which represent the slowest condition. FIG. 11(b) shows the output response with a load bus capacitance of 400 pf. Even with the large amount of capacitance, the present invention allows the signal time transition to ground at an acceptable rate. FIG. 11(a) shows that signals DRV4, DR5, and DRV6 are the major contributors which pull down the output signal using the larger drivers.

Embodiment #1

Figure 12:
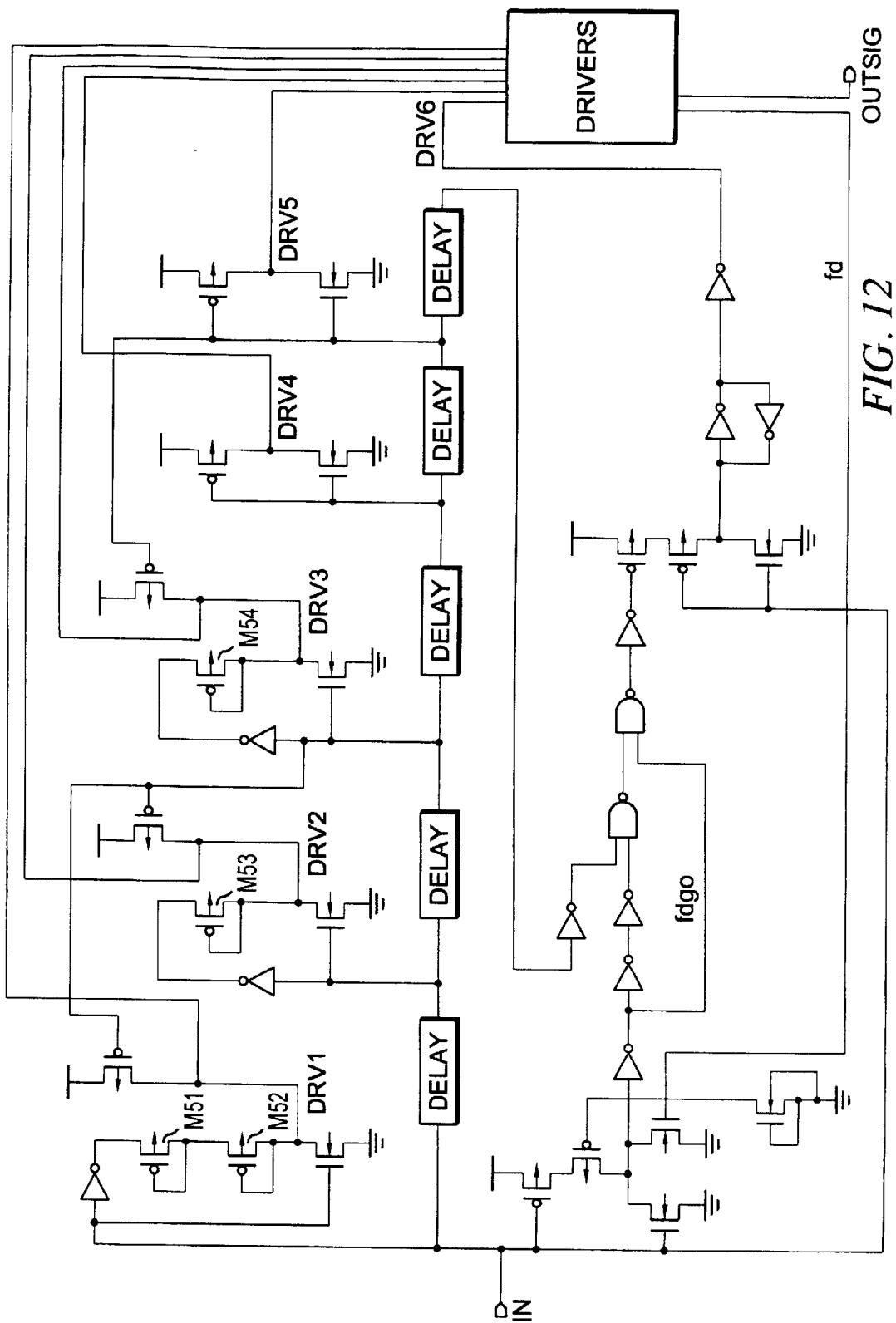
FIG. 12 is a circuit diagram of an embodiment of the present invention using P-channel devices.
Figure 13:
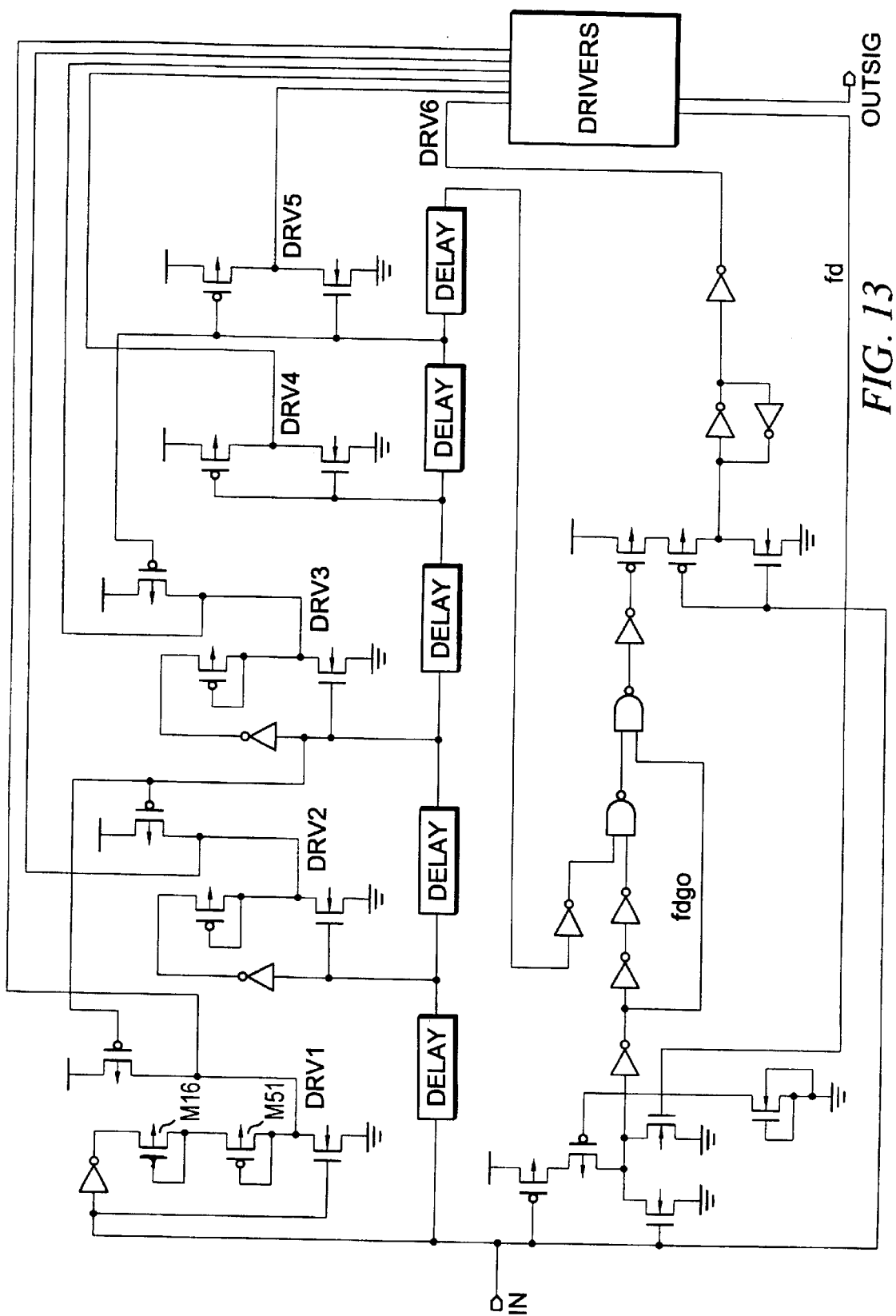
FIG. 13 is a circuit diagram of an embodiment of the present invention using both P-channel and N-channel devices.

There are a number of different approaches that can be used to supply the threshold voltage drops for the N-channel drivers. One approach is to use N-channel devices with their gate and drain tied together as shown in FIG. 6. A second approach is to use P-channel devices instead of N-channel devices as shown in FIG. 12. This figure shows m51, m52, m53 and m54 with their gates and drains tied together to produce the desired voltage levels. A third approach is to use a combination of N-channel and P-channel devices as shown in FIG. 13. FIG. 13 shows an N-channel, m16, supplying the first Vt drop and a P-channel, m51, supplying the second Vt Another important point is with regard to the device substrate contact. Normally, N-channel devices are connected to the substrate (VSS) and P-channel devices are connected to the nwell (VDD) for a p substrate process. However, to eliminate the effects of body-effected thresholds, the devices could be fabricated in their own well, which would subsequently perform better with variations in process, temperature and voltage. This is due to how the threshold voltages change from one condition to another since the change would be larger for body-effected thresholds than when the source to substrate voltage of the device is equal to zero.

There are a total of three P-channel pull-up devices attached to the Vt drop circuits which, as explained in the present invention, are used to pull the DRV signals up to VDD. If the designer wanted to wait until the last possible stage to turn on these particular P-channels, then the gates of the P-channels could be connected to latched state. Therefore, these particular pull-up devices can be connected to any node desired depending on the designer's goals.

Instead of the input signal activating only the first V, drop stage, it may simultaneously activates the second such that the delayed signal eventually propagates to the third and fourth stages. This type of arrangement uses fewer delay elements, which would essentially decrease the output fall time of OUTSIG.

Figure 14:
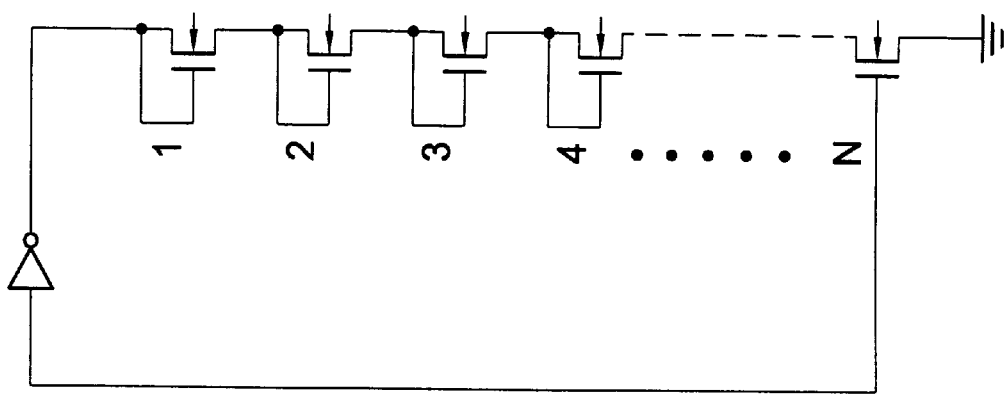
FIG. 14 is a schematic diagram indicating that the number of devices for threshold voltage (Vt) drops can range from 1 to N.

FIG. 14 indicates how an individual could use as many N-channel devices or P-channel devices to obtain the threshold voltage drop desired depending on the drive strength and supply voltage, processing, temperature and bus impedance.

Figures 15, 16:
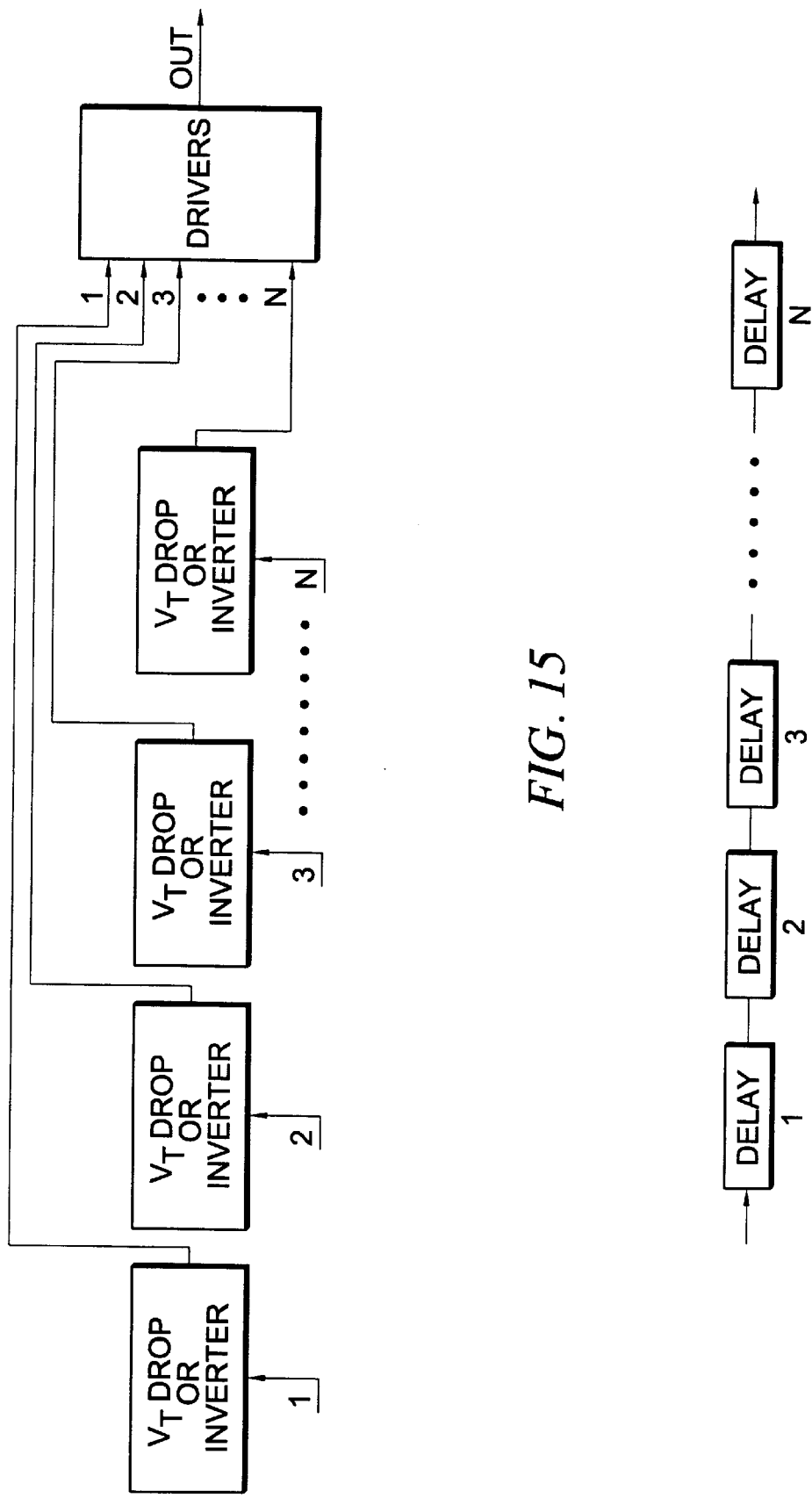
FIG. 15 is a schematic diagram indicating that the number of threshold voltage drop or inverter modules can range from 1 to N.
FIG. 16 is a schematic diagram indicating that the number of delays can range from 1 to N.

FIG. 15 illustrates the use of N number of instances for the threshold voltage drop or inverter modules which supply the drive signals for the output drivers. The number of modules would depend on how fast and to the desired output fall time. The more modules are used, the greater the output fall time and the faster the initial response of the output signal.

FIG. 16 points out that the number of delay modules could also be increased as desired to obtain the required output response depending on conditions such as process, temperature, voltage and bus impedance.

Having described and illustrated the principle of the invention in a preferred embodiment thereof, it is appreciated by those having skill in the art that the invention can be modified in arrangement and detail without departing from such principles. The applicant reserves the right to formulate new claims to such features and/or combinations of such features during the prosecution of the present application or of any further application derived therefrom.

We claim:

1. A driver circuit comprising:
    a plurality of delays connected in serial;
    a plurality of transistors connected to the plurality of delays, wherein at least one of the plurality of transistors is a strong inverter;
    a driver circuit connected to the plurality of transistors; and
    a digital logic circuit, wherein the digital logic circuit selectively activates the strong inverter upon the first occurrence of
        a feedback signal having a voltage below a predetermined voltage; and
        a signal from a final delay.

2. The circuit of claim 1, wherein the predetermined voltage is dependent upon a power supply voltage.

3. The circuit of claim 2, wherein the predetermined voltage is twenty-five percent of the power supply voltage.

4. The circuit of claim 1 wherein the plurality of transistors comprise at least one pull-up device, at least one threshold voltage drop device, and at least one inverter.

5. The circuit of claim 4 wherein at least one delay provides a signal two or more pull-up devices.

6. The circuit of claim 4, wherein the at least one threshold voltage drop device is used to bring an associated signal to at least one voltage threshold below power supply voltage.

7. The circuit of claim 4, wherein the at least one pull-up device is used to bring an associated signal to a power supply voltage.

8. The circuit of claim 4, wherein there are at least five stages such that:
    the plurality of delays comprises five delays;
    the at least one inverter comprises five inverters, wherein an input signal propagates simultaneously to one delay and one inverter during each of the at least five stages.

9. The circuit of claim 8, wherein a delay associated with the fifth stage is the final delay.

10. The circuit of claim 8, wherein each of the at least five stages has an associated output signal, further comprising:
    an additive driver for applying each of the associated output signals from each of the at least five stages and an output signal from the strong inverter to an output signal.

11. A method for driving an output signal on a transmission line comprising:
    measuring the feedback signal on a feedback signal run to determine whether the feedback signal drops below a predetermined voltage;
    receiving an input signal;
    activating a first transistor which is connected to a driver, wherein an output of the driver is connected to the feedback signal run; and
    delaying the input signal with a plurality of delay circuits, wherein an output signal of a final delay is connected to a digital logic circuit;
    activating a strong inverter upon the first of
        the feedback signal dropping below the predetermined voltage; and
        the output signal of the final delay reaching the digital logic circuit.

12. The method of claim 11 further comprising the step:
    driving an output signal on a transmission line based on at least one signal received from at least transistor, and an output signal received from the strong inverter.

13. The method of claim 12, comprising the step:
    dropping at least one voltage threshold from an output signal from at least one transistor, such that the output signal becomes at least one voltage threshold below power supply voltage.

14. The method of claim 12, comprising the step:
    increasing the voltage applied to an output signal from at least one transistor by using a pull-up device, such that the output signal becomes equal to power supply voltage.

* * * * *